(12) United States Patent
Nair

(10) Patent No.: US 6,522,568 B1
(45) Date of Patent: Feb. 18, 2003

(54) FERROELECTRIC MEMORY AND METHOD FOR READING THE SAME

(75) Inventor: Rajendran Nair, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/912,634

(22) Filed: Jul. 24, 2001

(51) Int. Cl.[7] ............................................. G11C 11/22
(52) U.S. Cl. .................. 365/145; 365/230.06; 365/207
(58) Field of Search ......................... 365/145, 230.06, 365/207, 189.09, 65, 117

(56) References Cited

U.S. PATENT DOCUMENTS

| | | | | |
|---|---|---|---|---|
| 5,013,137 A | * | 5/1991 | Tsuboyama et al. | ........... 345/97 |
| 5,912,835 A | * | 6/1999 | Katoh | ......................... 365/145 |
| 5,969,982 A | * | 10/1999 | Koo | ............................ 365/145 |

\* cited by examiner

*Primary Examiner*—David Lam
(74) *Attorney, Agent, or Firm*—Marger Johnson & McCollom, P.C.

(57) ABSTRACT

A ferroelectric memory device and method for reading such a device utilize an AC excitation on an active bit line to cancel sneak currents during a read operation. A memory device comprises an active ferroelectric cell disposed between an active word line and an active bit line, and a passive ferroelectric cell disposed between a passive word line and the active bit line. Peripheral circuitry is adapted to drive the active word line with active word line biasing, the passive word line with passive word line biasing, and the active bit line with an AC excitation during a read operation.

32 Claims, 7 Drawing Sheets

FERROELECTRIC MEMORY AND METHOD FOR READING THE SAME

BACKGROUND OF THE INVENTION

The present invention relates generally to electronic memory and, more particularly, to a ferroelectric memory device and a method of reading such a device.

Ferroelectric memory is a type of nonvolatile memory that utilizes the ferroelectric behavior of certain materials to retain data in a memory device in the form of positive and negative polarization, even in the absence of electric power. A ferroelectric material contains domains of similarly oriented electric dipoles that retain their orientation unless disturbed by some externally imposed electric force. The polarization of the material characterizes the extent to which these domains are aligned. The polarization can be reversed by the application of an electric field of sufficient strength and polarity.

FIG. 1 illustrates an exemplary known ferroelectric cell 10 in a ferroelectric memory array. A ferroelectric material 16 having a polarization P is sandwiched between a conductive word line 20 and a conductive bit line 22. An electric field may be applied to the ferroelectric cell by applying an electric potential (voltage) between the word line and the bit line so as to effect changes in the polarization of the ferroelectric material.

FIG. 2 shows a simplified hysteresis curve 24 that illustrates idealistically the polarization versus voltage properties of the exemplary ferroelectric cell of FIG. 1. When a positive voltage of sufficiently large magnitude (shown here, for example, as Vs) is applied to the cell, all of the domains in the cell are forced to align, to the extent possible, in the positive direction, and the polarization P reaches the saturation polarization Psat at point 25 on the curve. A further increase in the voltage produces no further increase in the polarization because all of the domains are already aligned as far as possible in the direction of the electric field produced by the voltage between the word line and bit line.

If the voltage is then reduced to zero (following path 32 to arrive at point 25), some of the domains switch their orientation (also referred to as rotating, flipping or reversing), but most of the domains retain their orientation. Thus, the ferroelectric material retains a remnant polarization Pr.

If a negative voltage of sufficiently large magnitude (shown here, for example, as —Vs) is then applied to the word line 20 relative to bit line 22 (following path 34 to point 27), all of the domains are forced to switch their orientation, and the polarization reaches the negative saturation level –Psat. Removing this negative voltage (following path 36 to point 23) allows some of the domains to switch, and the cell polarization reaches the negative remnant polarization –Pr, which it retains until it is disturbed again. If the positive voltage Vs is again applied to the cell (following path 30 to point 25), the domains once again switch their orientation, and the cell takes on the positive saturation polarization Psat.

For purposes of data storage, the ferroelectric cell 10 is considered to be in the logic "0" (zero) state when the polarization P is positive (preferably at Pr), and the logic "1" (one) state when the polarization is negative (preferably at –Pr).

A certain amount of charge is required to switch the polarity of a domain, so the further the polarization moves along the P axis in FIG. 2, the more domains that are switched and the more charge is required. Thus, the transition from the logic 1 state at point 23 to the logic 0 state at point 25 is accompanied by a substantial release of charge, whereas the transition from point 21 to 25 (no change of state) is accompanied by very little charge release.

This difference in charge release provides the fundamental principle for a "destructive" read of a ferroelectric cell. That is, a positive voltage sufficient to switch the polarization is applied to the cell while the charge released from the cell is observed. A large charge release indicates that the cell was a logic one, whereas little or no charge release indicates that the cell was a logic zero. The cell ends up in the zero state, regardless of its state before the read operation. Thus, a cell that was in the one state must then be rewritten as a one if further data retention is required.

Ferroelectric materials also exhibit resilience, wherein a ferroelectric cell can return to its remnant polarization despite a small disturbance. For example, assuming a one state storage condition for a ferroelectric cell, as represented by remnant polarization position 23 of hysteresis curve 24, a small voltage disturbance of $V_s/3$ provides a small polarization shift 40 along path 38. However, once the voltage is removed, domains of the ferroelectric cell realign their orientations to that of the cell's overall orientation, as illustrated by return path 39 of hysteresis curve 24.

DETAILED DESCRIPTION

Figure 1:
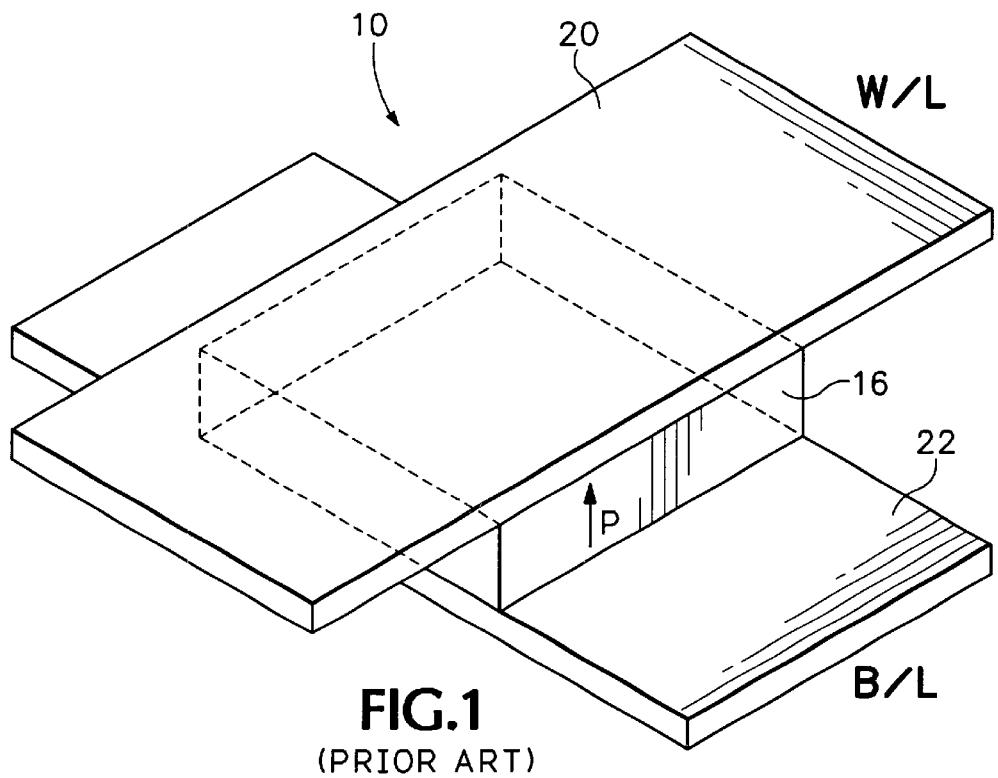
FIG. 1 illustrates an exemplary known ferroelectric cell in a ferroelectric memory array.
Figure 3:
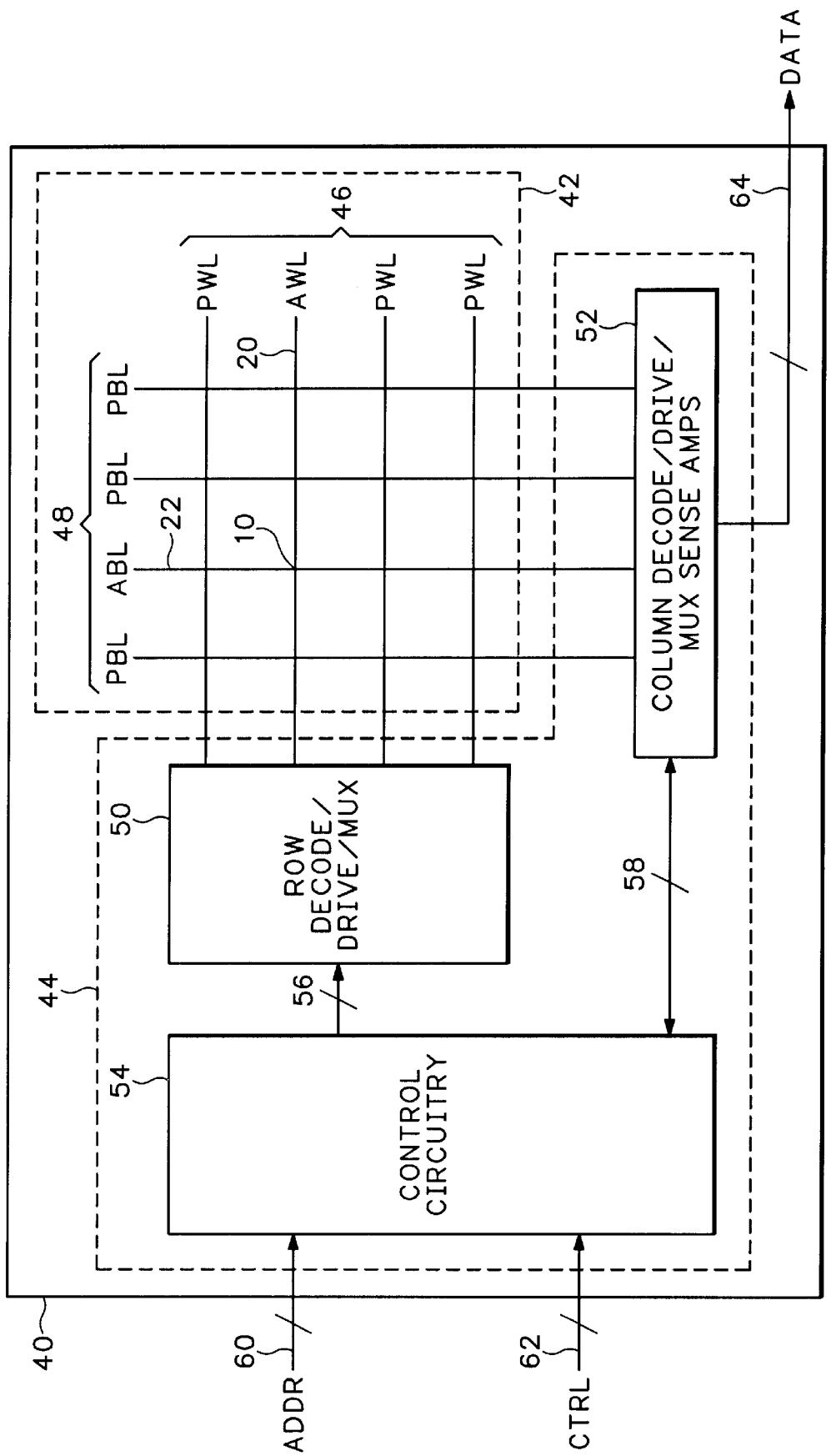
FIG. 3 is a block diagram of a ferroelectric memory device for an exemplary embodiment of the present invention.

FIG. 3 illustrates simplistically a ferroelectric memory device 40 for an exemplary embodiment of the present invention. Memory device 40 includes a cross-point passive matrix memory array 42 having word lines 46 that cross bit lines 48. Ferroelectric material is disposed between the word lines and bit lines to form ferroelectric cells at the intersections of word lines and bit lines. For example, a ferroelectric cell 10, such as that shown in FIG. 1, is located at the crossing of the word line identified as 20 and the bit line identified as 22 in FIG. 3. In this example, cell 10 is referred to as "active" because it identifies a specific cell that has been selected to read. The word line coupled to the active cell is identified as an active word line (AWL), whereas the remaining word lines are passive word lines (PWL). Likewise, the bit line coupled to the active cell is identified as the active bit line (ABL), whereas the remaining bit lines are passive bit lines (PBL).

When reading an active cell, a read or switching level voltage ($V_s$) is applied to the active word line 20. The read level voltage has a magnitude that is defined relative to the active bit line 22, and is sufficient to effect a polarization reversal of the active cell 10. Thus, the active cell is destructively read, wherein application of the read level voltage may switch the cell's polarization state. To restore the stored data after a polarization reversal, the data is written back into the active cell in a known fashion.

During the read, the passive bit lines and passive word lines are driven with voltages that provide quiescent level electric fields across the passive ferroelectric cells. Quiescent level voltages are defined in accordance with the resilient qualities of the ferroelectric cell, wherein polarization disturbances of the cells are kept within a recovery range. For example, in accordance with one exemplary embodiment of the present invention, the quiescent level is set to a magnitude no greater than ⅓ the switching level voltage.

Referring again to FIG. 3, the word lines 46 are driven by a row decoder block 50 that selects which of the word lines to drive as an active word line and which to drive as passive word lines in response to various control and buffered address signals 56 from control circuitry 54. The bit lines 48 are driven and sensed by a column decoder block 52 that selects which of the bit lines to drive and as an active bit line and which to drive as passive bit lines in response to various control and buffered address signals 58 from the control circuitry. The column decoder block 52 also includes one or more sense amplifiers to facilitate reading of the active ferroelectric cell to provide output data 64.

The control circuitry 54 includes some or all of various components such as address buffers, read sequencers, data samplers and the like for controlling the overall operation of the memory device 40 in response to address signals 60 and control signals 62 from outside the device.

The row decoder block 50 may include various components such as row decoders, word line drivers, multiplexers, low-to-high voltage converters, etc. as may be required for the particular architecture employed in the memory device. For example, if the memory array 42 is divided into subarrays, then a multiplexer may be used to switch the word line drive signals between the subarrays. Likewise, the column decoder block may include various combinations of column decoders, bit line drivers, mulitplexers, sense amplifiers, write drivers, etc.

Taken together, the control circuitry, row decoder block, and column decoder block form the peripheral circuitry 44 that interfaces the memory array 42 to the external world. However, the system of FIG. 3 is only exemplary, and various arrangements of peripheral circuitry may be employed without departing from the principles of present invention.

Figure 4:
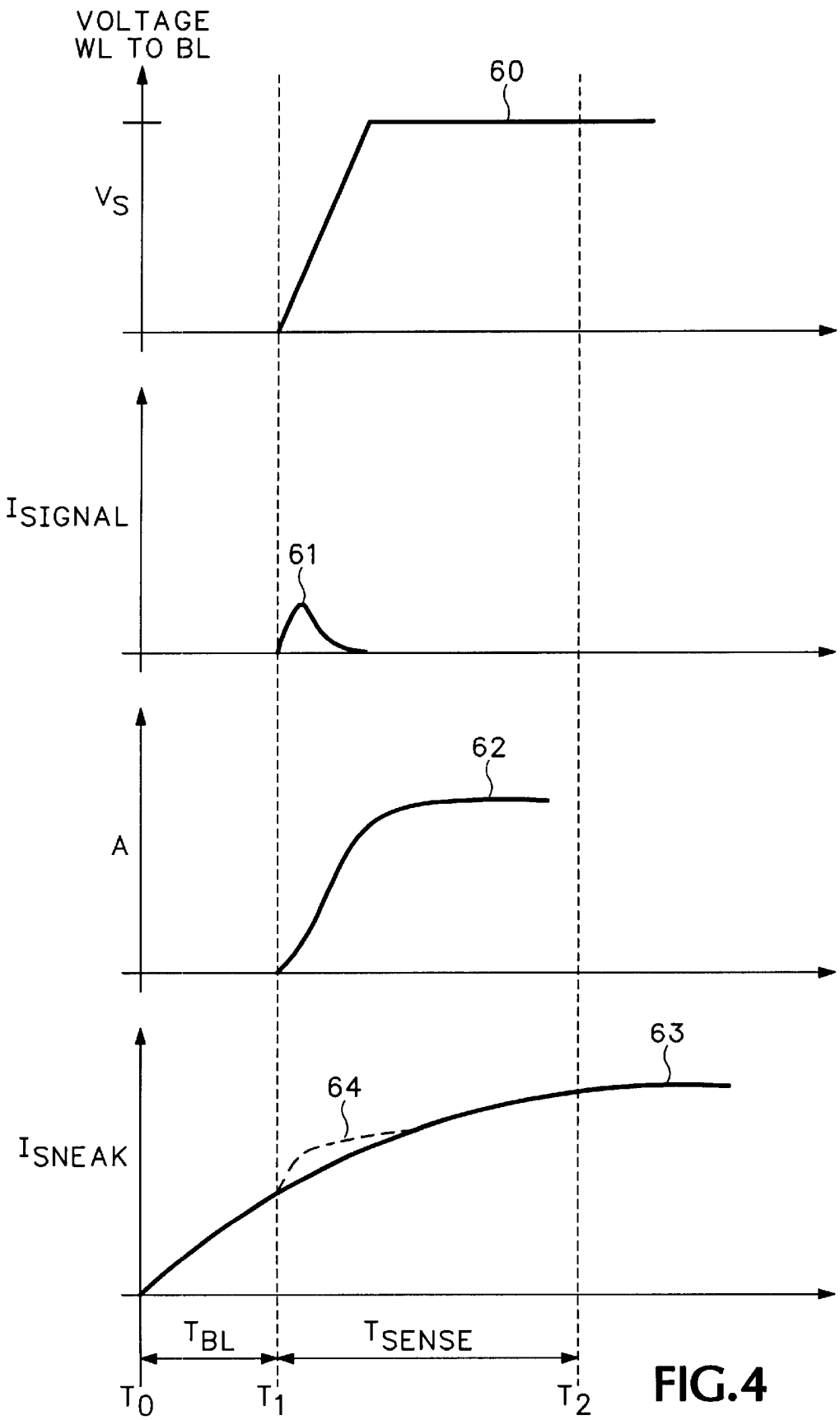
FIG. 4 is a timing diagram for illustrating sneak charge in a ferroelectric memory device.

FIG. 4 illustrates simplistically and ideally an exemplary method of reading a ferroelectric memory cell, such as cell 10 in FIG. 1, wherein charge is released and integrated during the application of a switching level voltage to the cell. After time duration $T_{BL}$ (e.g., a bit line settling time as will be described below), the word line is activated by applying a switching level voltage Vs to the word line 20 relative to the bit line 22, which is driven to zero volts. Through duration $T_{sense}$, the active cell, if it is in the logic "one" state (i.e., negative polarization), releases polarization reversal charge in the form of a signal current $I_{signal}$ shown as curve 61 through the bit line. This signal charge is integrated using an integrating sense amplifier to generate the integrated output signal A shown as curve 62. If the cell was in the logic "zero" state (i.e., positive polarization), little or no charge is released, the signal current is essentially zero, and thus, the integrated output signal A remains at zero.

Referring to FIG. 3, however, active bit line 22 is coupled not only to active cell 10, but also to other passive cells where it crosses the passive word lines. Likewise, active word line 20 is also coupled to passive cells associated with the passive bit lines. To prevent corruption of the data stored in the passive cells during a read operation, the passive word lines are driven with a passive word line biasing of Vs/3, and the passive bit lines are driven with a passive bit line biasing of 2Vs/3 at time $T_0$ in FIG. 4. Thus, none of the passive cells experiences a differential voltage greater than the quiescent voltage Vs/3 (also referred to as a disturb voltage), and, due to the resilient qualities of the ferroelectric cell, the polarization of the passive cells is not reversed.

However, although the quiescent bias of Vs/3 on the passive cells coupled to bit line 22 in FIG. 3 is not enough to reverse the cell polarization, it causes the passive cells to release "sneak charge" in the form of a sneak current $I_{sneak}$ shown (not to scale) as curve 63 in FIG. 4. The sneak charge form a single passive cell is typically much smaller than the polarization reversal charge of an active cell, but in a practical implementation, the active bit line is typically coupled to thousands of passive cells but only one active cell. Thus, the sneak current from the passive cells on the bit line overwhelms the actual signal current (shown summed with the sneak current as dashed curve 64) from the active cell. In a practical implementation, the magnitude of the sneak current can by hundreds of times that of the signal current. Although collectively much larger than the signal current, the sneak current increases at a slower rate (typically modeled as a 50 μs time constant) than the signal current which has a much shorter rise time.

Figure 5:
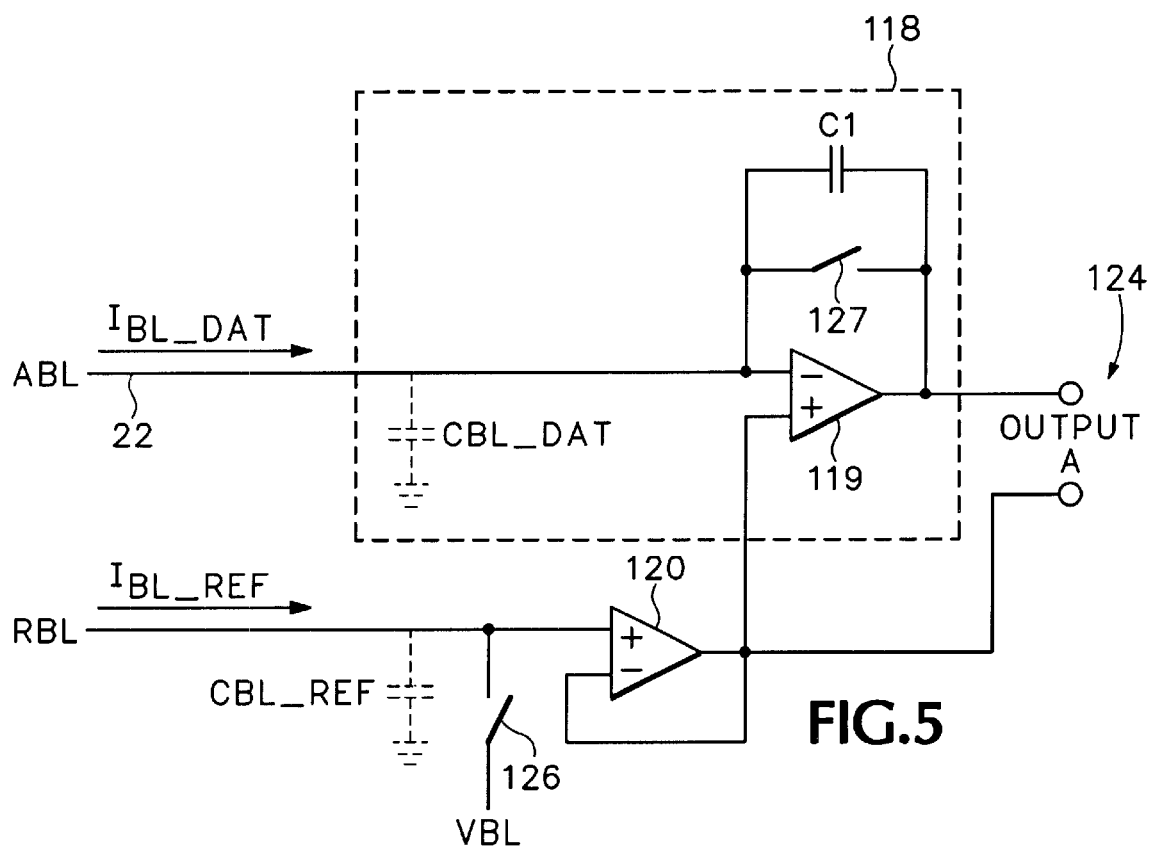
FIG. 5 is a schematic diagram of a known sense amplifier arrangement for reading a ferroelectric cell.

To distinguish the actual signal charge and current from the sneak charge and current, a sense amp arrangement such as that shown in FIG. 5 can be used to subtract an (ideally) equal sneak current obtained from a reference bit line RBL from the sneak current from the active bit line ABL, thereby integrating only the actual signal current. The sense amp circuit of FIG. 5 includes an integrating sense amp 118 comprised of an operational amplifier (op amp) 119 arranged as an integrator with capacitor C1 and reset switch 127 in its feedback network. The inverting input of the op amp is coupled to the active bit line ABL, typically through a multiplexer (not shown), to receive the current $I_{BL\_DAT}$, which includes a signal current component and a sneak signal component. The noninverting input of the op amp is coupled to the output of a reference amplifier 120 which is arranged as a voltage follower and coupled to a reference bit line RBL to receive the current $I_{BL\_REF}$ which is ideally a replica of the sneak current released by the active bit line. The active and reference bit lines have parasitic capacitances shown as $C_{BL\_DAT}$ and $C_{BLREF}$, respectively.

Figure 6:
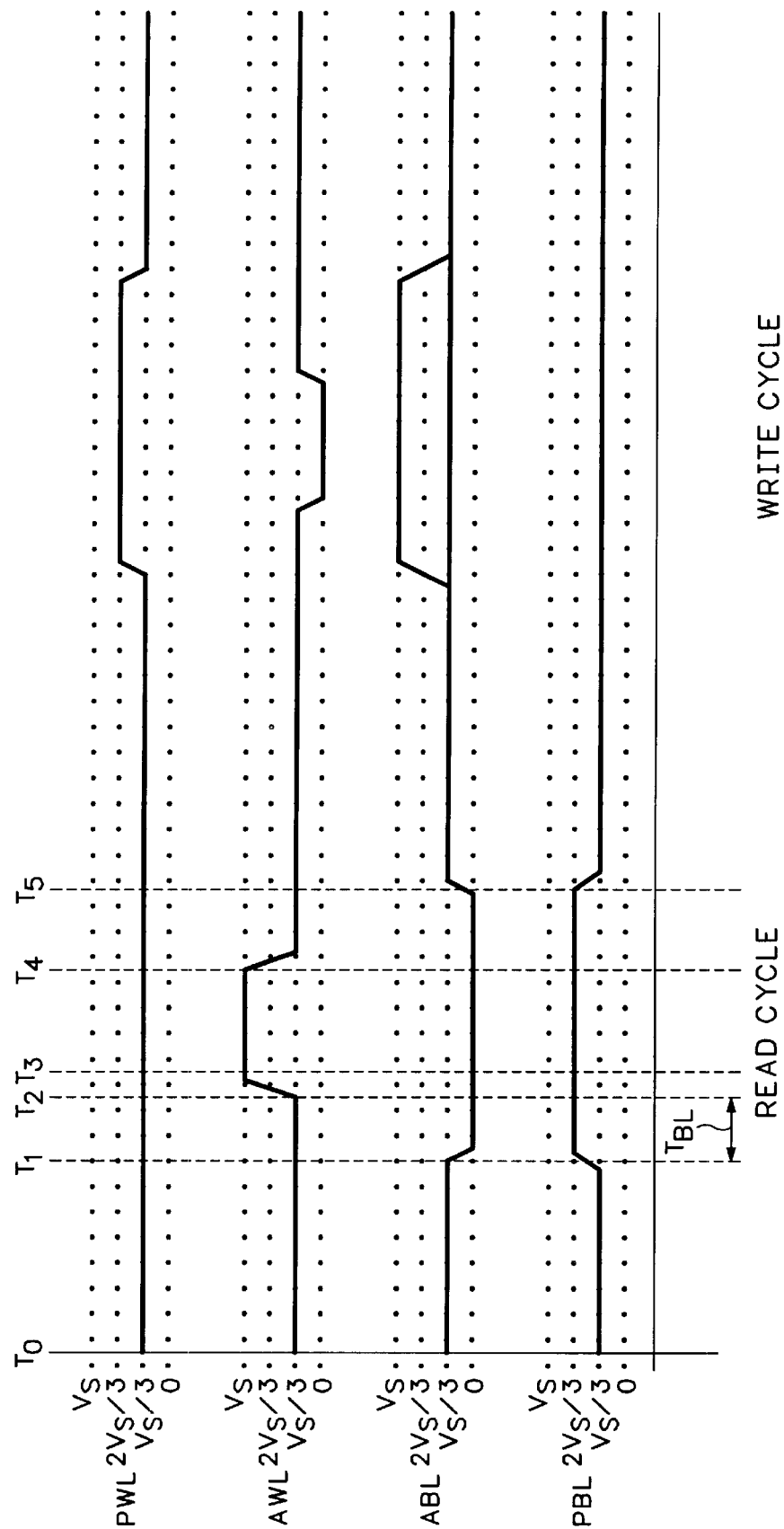
FIG. 6 is a timing diagram that illustrates a known method of reading a ferroelectric cell.

A prior art method of reading a ferroelectric memory cell with the sense amp arrangement of FIG. 5 will now be described with reference to FIG. 6. Word line and bit line signals 66, 68, 70 and 72 may be offset with a common DC voltage level, for example, such as a bit line offset voltage $V_{BL}$. For simplicity, however, the word line and bit line bias levels are described assuming a bit line offset bias $V_{BL}$ of 0 volts.

At time $T_0$, before initiation of a read cycle, the word lines and bit lines are all biased at the voltage level Vs/3. The first step of the read cycle comprises lowering the voltage level of the active bit line to 0 volts and increasing the voltage level of the passive bit lines to $2V_s/3$, as depicted at time $T_1$ in FIG. 6. At these levels, the ferroelectric cells between the word lines and active bit line experience a voltage potential of $V_s/3$, while the ferroelectric cells between the word lines and the passive bit lines experience a voltage potential of $-V_s/3$. Accordingly, during this first stage of the read cycle, cells in the 0 state between the word lines and passive bit lines will experience slight polarization shifts 44 as depicted by hysteresis curve 24 in FIG. 2.

On the other hand, cells in the 1 state that are associated with the active bit line experience a polarization shift 40 (via path 38 of hysteresis curve 24). These cells release a residual amount of sneak charge to provide a sneak current to the active bit line. The single read dual sense method shown in FIG. 6 begins with the bit line settling duration $T_{BL}$ between times $T_1$ and $T_2$ to allow the sneak current to stabilize before trying to determine the state of an active cell. Also during this duration, switch 126 of the sense amp arrangement of FIG. 5 is closed to precharge the reference bit line to $V_{BL}$ (in this case, 0 volts), and switch 127 is closed to prevent amplifier 118 from integrating. This also maintains the active bit line at $V_{BL}$ due to the virtual short circuit between the + and − terminals of the amplifier 118.

After the bit line settling duration $T_{BL}$, the active word line is driven with the active word line biasing $V_s$ as depicted by waveform 68 at time $T_2$. Since the active bit line remains at the active bit line biasing of 0 volts, the active ferroelectric cell located at the intersection of the active word line and active bit line receives the full read voltage potential sufficient for switching its polarization state. If the active cell is in the one state, a substantial signal charge is release to the active bit line. Alternatively, if the active cell is in the zero state, only a nominal amount of charge would propagate to the active bit line.

Figure 2:
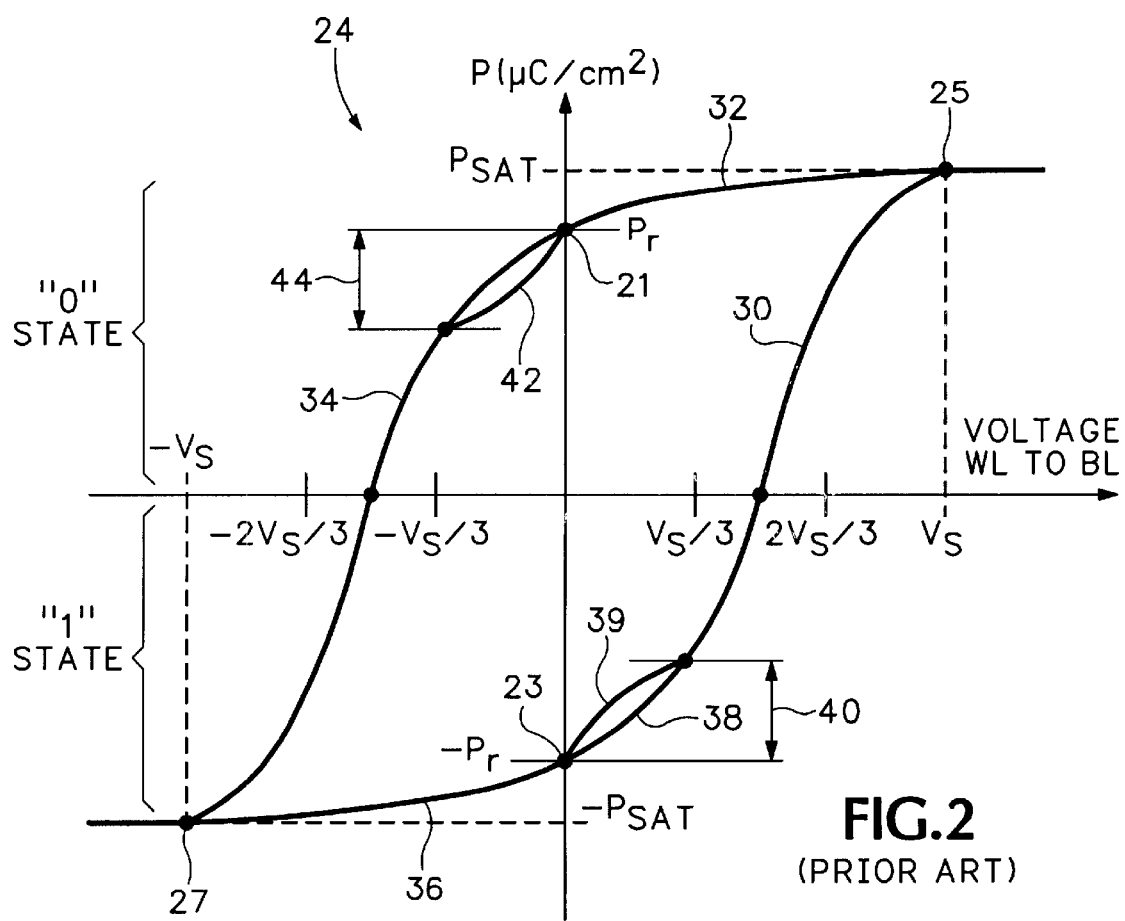
FIG. 2 is a graph of the polarization versus voltage properties of an exemplary ferroelectric cell.

Since the remnant polarization magnitude Pr shown in FIG. 2 is less than that of the saturation polarization Psat, a finite polarization change is effected as the level of the applied voltage changes from $V_s/3$ to $V_s$ (moving from point 21 along path 32 about a third of the way towards point 25 in FIG. 2) and a residual amount of charge would propagate to the active bit line for a zero state storage condition when the active word line transitions from $V_s/3$ to $V_s$. Nonetheless, the charge released from a cell of a zero state condition is substantially less than the amount of charge it would release for a one state condition.

A stray capacitance between the active word line and the active bit line will also contribute charge to the active bit line in response to the transition of the active word line voltage from the quiescent level to the switching level. In accordance with the method shown in FIG. 6, integration does not begin until after a short interval subsequent to "activation" of the active word line in order to avoid capture of residual charge associated with the capacitively coupled word line transition. Referring again to FIGS. 5 and 6, after the short delay, switch 127 opens and integration amplifier 118 integrates the charge propagated by the active bit line between times $T_3$ and $T_4$, thereby producing an integration value A at the output 124.

After completion of the integration, the voltage level of active word line 68 is returned to the quiescent level voltage $V_s/3$, as depicted by waveform 68 at time $T_4$, and then the passive and active bit lines, likewise, are returned to their quiescent level voltages of $V_s/3$, as shown by waveforms 70, 72 at time $T_5$. Having read the cell destructively, a write cycle is typically performed to restore, when necessary, a one state condition to the ferroelectric cell, as depicted by the remainder of the timing diagram of FIG. 6.

Figure 7:
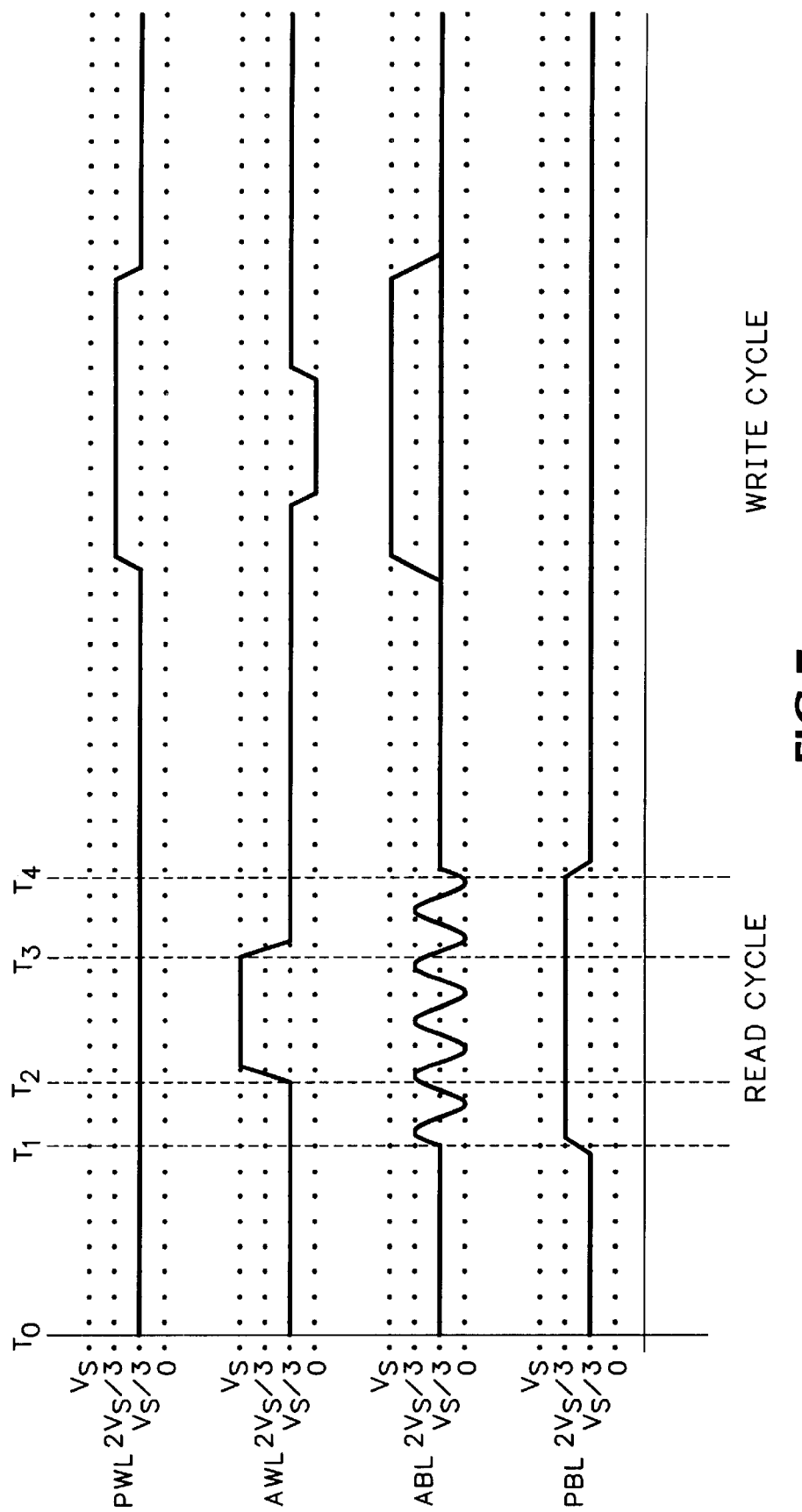
FIG. 7 is a timing diagram that illustrates an embodiment of a method of reading a ferroelectric cell in accordance with the present invention.

The present invention operates on the principle of applying an AC excitation to the active bit line during a read operation. An exemplary embodiment of a method for reading a ferroelectric cell in accordance with the present invention is illustrated in FIG. 7. All word lines and bit lines begin at the Vs/3 bias level at time $T_0$. At time $T_1$, the passive bit lines are driven with the passive bit line biasing of 2Vs/3. Rather than driving the active bit line to zero volts, however, the active bit line is driven with an AC excitation beginning at time $T_1$. This excitation has little or no DC component relative to the passive word line biasing so that sneak current from the passive cells on the active bit line is substantially cancelled during a sense operation. At time $T_2$, the active word line is driven with active word line biasing Vs and a sense amplifier begins integrating the charge released from the active bit line.

In the example embodiment shown in FIG. 7, the AC component of the AC excitation is ±Vs/3 and centered at Vs/3. Thus, the magnitude of the voltage between the passive word lines and the active bit line is never more than Vs/3, so the resilience of the passive cells from switching their logic states. The AC excitation applied to the active bit line has a DC component relative to the active word line biasing that is adequate to cause the polarization of the active ferroelectric cell to reverse during the time the active word line is biased at Vs. The half-period of the AC excitation is preferably made greater than the minimum permanent dipole switching time of the ferroelectric material in the memory cells to assure that polarization of the cell is actually allowed enough time to switch. The polarization reversal takes place over a number of cycles of the AC excitation with the signal charge release from the active cell taking on a diminishing amplitude with each cycle of the AC waveform.

At time $T_3$, the active word line is returned to Vs/3 and the integrating sense operation is concluded. If substantial net charge was released the from the active bit line, the active cell was a logic 1, whereas a cell at logic 0 would have released little, if any, net charge. At time $T_4$, the active and passive bit lines are returned to a quiescent level of Vs/3. Since the read operation is destructive, a write cycle is optionally performed to restore the active ferroelectric cell to the one state, if required, as depicted by the remainder of the timing diagram of FIG. 7.

Figure 8:
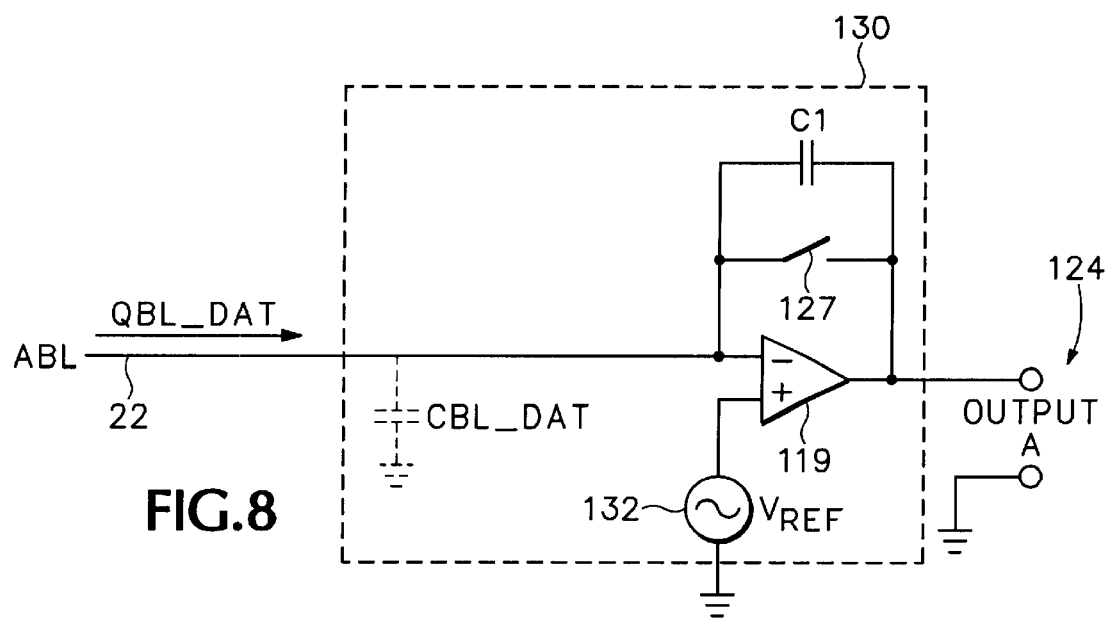
FIG. 8 is a schematic diagram of an embodiment of a sense amplifier arrangement in accordance with the present invention.

FIG. 8 is a schematic diagram of an embodiment of a sense amplifier arrangement in accordance with the present invention. The sense amp 130 of FIG. 8 is in many respects similar to that of FIG. 5, but instead of being arranged to receive a signal from a reference line, the noninverting input of the op amp 119 is coupled to a reference signal generator 132, which generates an AC reference signal $V_{REF}$. The op amp forces a virtual short circuit between its input terminals, so the sense amp drives the active bit line with the same waveform as the AC reference signal. Since the sneak current from the active bit line is cancelled in the integration process, the output signal A is simply the integral of the signal current from the active cell.

The operational amplifier is preferably designed to have adequate drive capability to overcome the losses caused by the parasitics of the bit line. To eliminate these losses, the sense amp may be designed to operate at the resonant frequency of the bit, thereby reducing power consumption.

An advantage of the present invention is that it eliminates the need for a reference bit line, thereby increasing the memory array area usable for actual memory cells.

Another advantage of the present invention is that it improves the signal to sneak ratio by minimizing the net sneak charge released. The weak ferroelectric domains in the inactive cells coupled to the active bit line are subjected to electric fields in both directions, thereby releasing both positive and negative charge. Assuming the positive and negative sneak charge release is more or less equal, the average sneak charge released in greatly minimized. This allows for higher gain in the sense circuitry, thereby enabling the sensing of smaller values of signals from the ferroelectric cells. This, in turn, enables both scaling to lower dimensions and therefore greater memory dimensions, as well as longer lifetimes from the memory array products.

Figure 9:
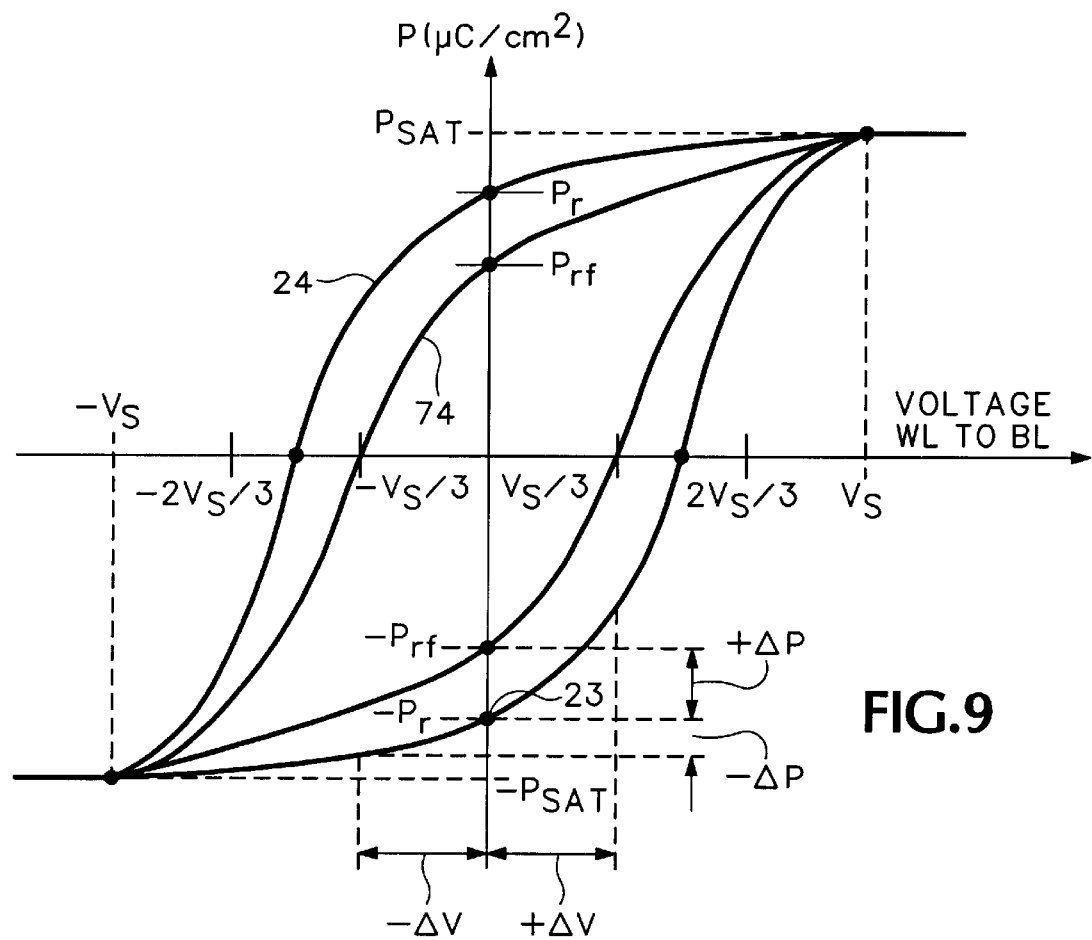
FIG. 9 is a graph of the polarization versus voltage properties of an embodiment of a ferroelectric cell in accordance with the present invention.

This ability to sense smaller signals from the active cell is especially important because the remnant polarization, and thus, signal current, for a cell decreases as the cell fatigues over its lifetime. This is illustrated in FIG. 9, which shows essentially the same curve 24 from FIG. 2 superimposed on the hysteresis curve 74 for a fatigued cell. The remnant polarization $P_{rf}$ for a fatigued cell is substantially lower than $P_r$ for a newer cell having a hysteresis curve such as curve 24. By allowing higher gain in the sense amp, and consequent sensing of lower signal currents, the present invention helps accommodate this fatigue as a ferroelectric cell ages.

A ferroelectric memory device in accordance with the present invention is preferably fabricated with cells having ferroelectric material that is maximally symmetrical around the P-axis. This can be understood with reference to FIG. 9 which shows how changes in the voltage across the cell causes changes in the polarization P, and thus polarization charge and current. If the voltage across the cell is zero, and cell polarization is at its negative remnant polarization –Pr (point 23 on curve 24), positive and negative disturb voltages +ΔV and –ΔV cause positive and negative changes in the polarization +ΔP and –ΔP, respectively. If the curvature at point 23 is not symmetrical, equal values of +ΔV and –ΔV result in unequal values of +ΔP and –ΔP. This results in a certain amount of data dependency in the sneak current cancellation.

Advantageously, however, this sensitivity to curvature is somewhat self-correcting over time and actually results in the sneak current cancellation becoming more accurate at the cell ages. This is because the curvature of the hysteresis curve about the P-axis tends to become more symmetric as the cell fatigues as can be seen in FIG. 9.

Although a preferred embodiment of the present invention is illustrated with reference to FIGS. 7–9, the present invention is not limited to the details of this embodiment. For example, although it is preferable to apply the AC excitation to the active bit line before driving the active word line with the active word line biasing, the AC excitation could be started at the same time as, or even after, the active word line is driven to Vs. Additionally, even though the AC excitation preferably has a frequency that is high enough to provide several cycles during the time the active word line is at the read voltage Vs, the active bit line need only experience one polarity change in the AC component of the signal during the sense operation so that at least some of the sneak current is cancelled.

In the example embodiment shown in FIG. 7, the bias voltage levels are chosen for convenience as Vs, Vs/3, zero, etc., where the read level voltage Vs happens to coincide with the voltage (typically in the range of 10–20 volts for a practical implementation) at which the ferroelectric cell reaches its saturation polarization Psat in FIG. 2. However, the present invention is not limited to these specific values.

Also, the present invention is not limited to implementations that utilize integrating sense amplifiers. For example, as explained above, the sneak charge release from the active bit line is much slower than the signal charge release. Thus, if the cycle time of the AC excitation is selected between the time constant of the sneak charge release and the time constant of the signal charge release, a high-pass filter circuit may be used to differentiate between the fast charge release of the signal current and the slow charge release of the sneak current.

Having described and illustrated the principles of the invention in a preferred embodiment thereof, it should be apparent that the invention can be modified in arrangement and detail without departing from such principles. Accordingly, such changes and modifications are considered to fall within the scope of the following claims.

What is claimed is:

1. A memory device comprising:
    a first ferroelectric cell disposed between a first word line and a bit line;
    a second ferroelectric cell disposed between a second word line and the bit line;
    a word line driver coupled to the first and second word lines and adapted to drive the first word line with active word line biasing and drive the second word line with passive word line biasing during a read operation; and
    a bit line driver coupled to the bit line and adapted to drive the bit line with an AC excitation during the read operation.

2. A memory device comprising:
    a first ferroelectric cell disposed between a first word line and a bit line;
    a second ferroelectric cell disposed between a second word line and the bit line;
    a word line driver coupled to the first and second word lines and adapted to drive the first word line with active word line biasing and drive the second word line with passive word line biasing during a read operation; and
    a bit line driver coupled to the bit line and adapted to drive the bit line with an AC excitation during the read operation;
    wherein the AC excitation has a small enough DC component relative to the passive word line biasing such that sneak current from the second memory cell is substantially cancelled.

3. A memory device comprising:
    a first ferroelectric cell disposed between a first word line and a bit line;
    a second ferroelectric cell disposed between a second word line and the bit line;
    a word line driver coupled to the first and second word lines and adapted to drive the first word line with active word line biasing and drive the second word line with passive word line biasing during a read operation; and
    a bit line driver coupled to the bit line and adapted to drive the bit line with an AC excitation during the read operation;
    wherein the AC excitation has a DC component relative to the active word line biasing that is adequate to cause the polarization of the first ferroelectric cell to reverse during the read operation.

4. A memory device comprising:
a first ferroelectric cell disposed between a first word line and a bit line;
a second ferroelectric cell disposed between a second word line and the bit line;
a word line driver coupled to the first and second word lines and adapted to drive the first word line with active word line biasing and drive the second word line with passive word line biasing during a read operation; and
a bit line driver coupled to the bit line and adapted to drive the bit line with an AC excitation during the read operation;
wherein the word line driver and the bit line driver are adapted to apply the AC excitation to the bit line before applying the active word line biasing to the first word line during the read operation.

5. A memory device comprising:
a first ferroelectric cell disposed between a first word line and a bit line;
a second ferroelectric cell disposed between a second word line and the bit line;
a word line driver coupled to the first and second word lines and adapted to drive the first word line with active word line biasing and drive the second word line with passive word line biasing during a read operation; and
a bit line driver coupled to the bit line and adapted to drive the bit line with an AC excitation during the read operation;
wherein the AC excitation has a half-period that is greater than a dipole switching time of the first ferroelectric cell.

6. A memory device comprising:
a first ferroelectric cell disposed between a first word line and a bit line;
a second ferroelectric cell disposed between a second word line and the bit line;
a word line driver coupled to the first and second word lines and adapted to drive the first word line with active word line biasing and drive the second word line with passive word line biasing during a read operation; and
a bit line driver coupled to the bit line and adapted to drive the bit line with an AC excitation during the read operation;
wherein the word line driver and the bit line driver are adapted such that the active word line biasing is applied to the first word line during a plurality of cycles of the AC excitation.

7. A memory device comprising:
a first ferroelectric cell disposed between a first word line and a bit line;
a second ferroelectric cell disposed between a second word line and the bit line;
a word line driver coupled to the first and second word lines and adapted to drive the first word line with active word line biasing and drive the second word line with passive word line biasing during a read operation; and
a bit line driver coupled to the bit line and adapted to drive the bit line with an AC excitation during the read operation;
wherein the bit line driver comprises:
an operational amplifier having a first input terminal coupled to the bit line; and
a feedback network coupled between an output terminal and the input terminal of the operational amplifier.

8. A memory device according to claim 7 wherein the operational amplifier has a second input terminal coupled to receive an AC reference signal.

9. A memory device according to claim 8 wherein the feedback network comprises a capacitor.

10. A semiconductor die having a memory device fabricated thereon, the memory device comprising:
a plurality of word lines;
a plurality of bit lines crossing said word lines;
ferroelectric material disposed between the word lines and bit lines; and
peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;
wherein the peripheral circuitry is adapted to generate the active bit line biasing as an AC excitation during a read operation.

11. A semiconductor die having a memory device fabricated thereon, the memory device comprising:
a plurality of word lines;
a plurality of bit lines crossing said word lines;
ferroelectric material disposed between the word lines and bit lines; and
peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;
wherein the peripheral circuitry is adapted to generate the active bit line biasing as an AC excitation during a read operation; and
wherein the active bit line biasing has a small enough DC component relative to the passive word line biasing such that sneak current on the selected bit line is substantially cancelled during the read operation.

12. A semiconductor die having a memory device fabricated thereon, the memory device comprising:
a plurality of word lines;
a plurality of bit lines crossing said word lines;
ferroelectric material disposed between the word lines and bit lines; and
peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;
wherein the peripheral circuitry is adapted to generate the active bit line biasing as an AC excitation during a read operation; and
wherein the active bit line biasing has a DC component relative to the active word line biasing that is adequate to cause reversal of the polarization of ferroelectric material between the selected word line and the selected bit line during the read operation.

13. A semiconductor die having a memory device fabricated thereon, the memory device comprising:
a plurality of word lines;
a plurality of bit lines crossing said word lines;
ferroelectric material disposed between the word lines and bit lines; and peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;

wherein the peripheral circuitry is adapted to generate the active bit line biasing as an AC excitation during a read operation; and wherein the peripheral circuitry is adapted to apply the AC excitation to the selected bit line before applying the active word line biasing to the selected word line during the read operation.

14. A semiconductor die having a memory device fabricated thereon, the memory device comprising:

a plurality of word lines;

a plurality of bit lines crossing said word lines;

ferroelectric material disposed between the word lines and bit lines; and peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;

wherein the peripheral circuitry is adapted to generate the active bit line biasing as an AC excitation during a read operation; and wherein the AC excitation has a half-period that is greater than the dipole switching time of the ferroelectric material.

15. A semiconductor die having a memory device fabricated thereon, the memory device comprising:

a plurality of word lines;

a plurality of bit lines crossing said word lines;

ferroelectric material disposed between the word lines and bit lines; and peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;

wherein the peripheral circuitry is adapted to generate the active bit line biasing as an AC excitation during a read operation; and wherein the peripheral circuitry is adapted to apply the active word line biasing to the selected word line during a plurality of cycles of the AC excitation.

16. A semiconductor die having a memory device fabricated thereon, the memory device comprising:

a plurality of word lines;

a plurality of bit lines crossing said word lines;

ferroelectric material disposed between the word lines and bit lines; and peripheral circuitry coupled to the word lines and bit lines and adapted to drive a select one of the word lines with active word line biasing, drive other of the word lines with passive word line biasing, drive a select one of the bit lines with active bit line biasing, and drive other of the bit lines with passive word line biasing;

wherein the peripheral circuitry is adapted to generate the active bit line biasing as an AC excitation during a read operation; and wherein the peripheral circuitry comprises:

an operational amplifier having a first input terminal coupled to the selected bit line; and a feedback network coupled between an output terminal and the input terminal of the operational amplifier.

17. A semiconductor die according to claim 16 wherein the operational amplifier has a second input terminal coupled to receive an AC reference signal.

18. A semiconductor die according to claim 17 wherein the feedback network comprises a capacitor.

19. A method for reading a ferroelectric cell comprising:

driving a conductive line coupled to the cell with an AC excitation; and sensing charge released from the cell responsive to the AC excitation.

20. A method for reading a ferroelectric cell comprising:

driving a conductive line coupled to the cell with an AC excitation; and sensing charge released from the cell responsive to the AC excitation;

wherein the conductive line is a first conductive line, the ferroelectric cell is a first ferroelectric cell disposed between the first and second conductive lines, and the method further comprises:

driving the second conductive line with a read voltage relative to the first conductive line; and driving a third conductive line with a quiescent voltage relative to the second conductive line, wherein the third conductive line is coupled to a second ferroelectric cell disposed between the second and third conductive lines.

21. A method according to claim 20 wherein sensing charge released from the first ferroelectric cell comprises integrating current from the first conductive line.

22. A method according to claim 20 wherein the AC excitation has a half-period that is less than a pulse width of the read voltage level.

23. A method according to claim 20 wherein driving the first conductive line with an AC excitation comprises driving the first conductive line with an AC excitation before driving the second conductive line with the read voltage level.

24. A method according to claim 20 wherein driving the first conductive line with an AC excitation comprises adding an AC excitation voltage to a quiescent voltage level of the first conductive line.

25. A method according to claim 20 wherein the AC excitation has a half-period that is greater than a dipole switching time of the first ferroelectric cell.

26. A method according to claim 20 wherein driving a conductive line coupled to the cell with an AC excitation and sensing charge released from the cell responsive to the AC excitation comprises:

driving a first input of an integrating amplifier with the first conductive line; and driving a second input of the integrating amplifier with an AC reference signal.

27. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation.

28. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation;

wherein the AC excitation has a small enough DC component relative to the passive word line biasing such that sneak current from the second memory cell is substantially cancelled.

29. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation;

wherein the AC excitation has a DC component relative to the active word line biasing that is adequate to cause the polarization of the first ferroelectric cell to reverse during the read operation.

30. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation;

wherein the means for driving the first word line and means for driving the bit line are adapted to apply the AC excitation to the bit line before applying the active word line biasing to the first word line during the read operation.

31. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation;

wherein the AC excitation has a half-period that is greater than a dipole switching time of the first ferroelectric cell.

32. A memory device comprising:

a first ferroelectric cell disposed between a first word line and a bit line;

a second ferroelectric cell disposed between a second word line and the bit line;

means for driving the first word line with active word line biasing and driving the second word line with passive word line biasing during a read operation; and means for driving the bit line with an AC excitation during the read operation;

wherein the means for driving the first word line and means for driving the bit line are adapted such that the active word line biasing is applied to the first word line during a plurality of cycles of the AC excitation.

* * * * *